United States Patent [19]
Anderson et al.

[11] Patent Number: 6,064,266
[45] Date of Patent: May 16, 2000

[54] LOAD LIMITING CIRCUIT AND METHOD FOR LIMITING THE OUTPUT IMPEDANCE SEEN BY AN AMPLIFIER

[75] Inventors: Dale Robert Anderson; James Orah Ashabraner, both of Fort Worth, Tex.

[73] Assignee: Motorola, Inc., Schaumburg, Ill.

[21] Appl. No.: 09/153,799

[22] Filed: Sep. 15, 1998

[51] Int. Cl.[7] .................................................. H03G 3/10
[52] U.S. Cl. .......................................... 330/284; 330/298
[58] Field of Search ................................. 330/284, 298, 330/207 P

[56] References Cited

U.S. PATENT DOCUMENTS

| | | | |
|---|---|---|---|
| 3,904,971 | 9/1975 | Delagrange | 330/29 |
| 4,013,925 | 3/1977 | Tice et al. | 361/18 |
| 4,270,159 | 5/1981 | Buckle | 361/79 |
| 4,301,490 | 11/1981 | Nagel et al. | 361/89 |
| 5,936,470 | 8/1999 | Stroud | 330/284 |

*Primary Examiner*—Benny Lee
*Assistant Examiner*—Henry Choe
*Attorney, Agent, or Firm*—Richard A. Sonnentag; Mario J. Donato, Jr.

[57] ABSTRACT

A load limiting circuit (56) and method for limiting the output impedance seen by an amplifier (12), wherein a load limiting impedance (64), preferably a resister (94), is selectively coupled in parallel with the output impedance by a switch circuit (62), when a threshold detect circuit (60) detects the value of the output impedance (48) rising above a predetermined value. The output impedance is preferably measured by monitoring the output current through a resistor (70) connected in series with the output impedance (48).

9 Claims, 3 Drawing Sheets

LOAD LIMITING CIRCUIT AND METHOD FOR LIMITING THE OUTPUT IMPEDANCE SEEN BY AN AMPLIFIER

FIELD OF THE INVENTION

The present invention relates to a load conditioning circuit coupled to the output of an amplifier and more specifically to a load limiting circuit and method for limiting the output impedance seen by an amplifier.

BACKGROUND OF THE INVENTION

Class S amplifiers/modulators are used for both amplification and amplitude modulation of a signal, especially in radio frequency applications. The popularity of class S amplifiers/modulators is due, in part, to the high rate of efficiency possible using class S techniques, which in many cases is close to 100 percent. At least one example where the use of class S amplifiers/modulators has been previously effective is in narrowband applications. Narrowband applications are applications where the frequency range of the input signal is relatively limited.

However for some uses, where it is desirable to operate over a relatively wider range of input frequencies, including higher input and output frequencies, the effectiveness of circuits using class S amplifiers/modulators is diminished. One example of a use where the performance of circuits using class S amplifiers/modulators begins to degrade is their use in a code division multiple access (CDMA) power amplifier supply modulator of a cellular communication system.

In a CDMA power amplifier supply modulator, a class S amplifier/modulator would preferably be used to provide the DC power to a radio frequency power amplifier. In this environment the power amplifier stage is typically a class AB radio frequency amplifier.

FIG. 1 shows a block diagram 10 generally depicting an amplifier 12 for receiving a sinusoidal input signal 14 and producing an amplified output signal. In the preferred embodiment the amplifier corresponds to a class S amplifier/modulator 12, which includes a pulse width modulation circuit (PWM) 16 and a low pass filter 18.

FIG. 2 shows a circuit schematic 20 of an example of an output drive stage and low pass filter for a class S amplifier. The output drive stage is part of the PWM circuit 16. The output drive stage includes a pair of transistors; 22 and 24 arranged in a totem pole configuration. The source of transistor 22 is coupled to the supply voltage 26 and the drain of transistor 22 is coupled to the source of transistor 24. The drain of transistor 24 is coupled to ground 28. The gates of transistors 22 and 24 are each coupled to separate drivers 30 and 32. The connection between the drain of transistor 22 and the source of transistor 24 forms an output of the output drive stage, which is coupled to the input of a low pass filter.

The low pass filter includes a pair of LC circuits, wherein the inductors 34 and 36 are coupled in series with the output signal path, and the capacitors 38 and 40 are coupled across the output signal path and ground 28.

The output drive stage produces a pulse modulated signal having a varying duty ratio. The low pass filter receives the pulse modulated signal and produces an output signal having a more slowly varying DC or average voltage component to appear at the output load.

The output drive stage, illustrated in FIG. 2, will generally operate efficiently for signals having a frequency up to 1 MHz, however for signals greater than 1 MHz, the efficiency of the output drive stage begins to significantly degrade.

An alternative output drive stage using class S techniques, capable of efficient operation for higher frequency signals, is provided for in FIG. 3. FIG. 3 shows a circuit schematic 42 of an output drive stage and low pass filter for a class S modulator.

The output drive stage and low pass filter 42 of FIG. 3 differs from the output drive stage and low pass filter 20 of FIG. 2, in that in place of the transistor 24, a commutating diode 44 is used. The commutating diode 44 has its anode coupled to the drain of transistor 22 and its cathode coupled to ground 28. Correspondingly the second driver 32 is not present. The output drive stage of FIG. 3, further includes a second diode 46 having its anode coupled to the supply voltage 26 and its cathode coupled to the drain of transistor 22 and the anode of the commutating diode 44, which corresponds to the output of the output drive stage and the input of the low pass filter.

A class S modulator having the output drive stage and low pass filter 42 of FIG. 3, is capable of efficiently operating at higher operating frequencies, however is much more sensitive to variations in the output impedance. The output drive stage of FIG. 3, experiences a degradation in performance when the output impedance exceeds approximately 10 times the average design load.

For a CDMA power amplifier supply modulator, as identified above, a class S amplifier/modulator would preferably be used as a DC power supply, for producing an output signal which would be used as the power supply input to a subsequent class AB radio frequency amplifier stage. The input impedance of a class AB amplifier provides an output load impedance for the class S amplifier/modulator which can be closely approximated as a current source 48, whose magnitude is proportional to the sum of the quiescent bias current plus the instantaneous envelope current. The current source 48 is shown in FIG. 1.

The input signal can be represented by the equation:

$$V_{in}(t) = A \cos(\omega_m t) + V_p(t)$$

Correspondingly, the output current which is proportional to the input signal can be represented by the equation:

$$i_e(t) = b \cos(\omega_m t) + dc_i$$

The output voltage can be represented by the equation:

$$V_e(t) = a \cos(\omega_m t + \phi_e(t)) + dc_v$$

wherein $\phi_e(t)$ represents the phase difference between the output current $i_e(t)$ and the output voltage $v_e(t)$, which results from the current source having an equivalent impedance $Z_{Load}$, which includes both a real and a reactive component.

If $Z_{Load}$ were purely resistive, $\phi_e(t)$ would equal zero, and the output impedance would be relatively constant, allowing for the efficient use of the output drive stage and low pass filter 42, shown in FIG. 3. However in most instances $\phi_e(t)$ will not equal zero, and will result in an output impedance $Z_{Load}$, which will vary over time. The output impedance $Z_{Load}$ is equal to the output voltage $V_e(t)$ divided by the output current $i_e(t)$.

As a function of time the output impedance $Z_{Load}$ is graphically, represented by graph 50, shown in FIG. 4. The spikes 52 represent the maximum value of the output impedance $Z_{Load}$, which occurs when the output current $i_e(t)$ is approximately zero. The valleys 54 represent the minimum value of the output impedance $Z_{Load}$, which occurs when the output voltage $V_e(t)$ is approximately zero. The output impedance $Z_{Load}$ often will vary by a factor greater than 10 times the average design load. As previously identified, the largely varying output impedance $Z_{Load}$ will interfere with the efficient operation of the class S modulator having the output drive stage and low pass filter, shown in FIG. 3. Therefore a load limiting circuit and method for limiting the output impedance seen by an amplifier would be beneficial.

DETAILED DESCRIPTION OF THE PREFERRED EMBODIMENT

The present invention provides for a load limiting circuit and method for limiting the output impedance seen by an amplifier, wherein a load limiting impedance is selectively coupled in parallel with the output impedance, when the output impedance rises above a predetermined value.

Stated more specifically a load limiting circuit for limiting the output impedance seen by an amplifier is provided comprising a load monitoring circuit for detecting the value of the output impedance, and a threshold detect circuit, coupled to said load monitoring circuit for comparing the value of the output impedance to a predetermined value. The load limiting circuit further comprises a load limiting impedance, and a switch circuit coupled to said threshold detect circuit arid said load limiting impedance for selectively coupling said load limiting impedance in parallel with the output impedance when the value of the output impedance rises above said predetermined value.

Furthermore a method is provided for limiting the output impedance seen by an amplifier. The method comprises the steps of detecting the value of the output impedance, comparing the value of the output impedance to a predetermined value, and selectively coupling a load limiting impedance in parallel with the output impedance when the value of the output impedance rises above said predetermined value.

Figure 1:
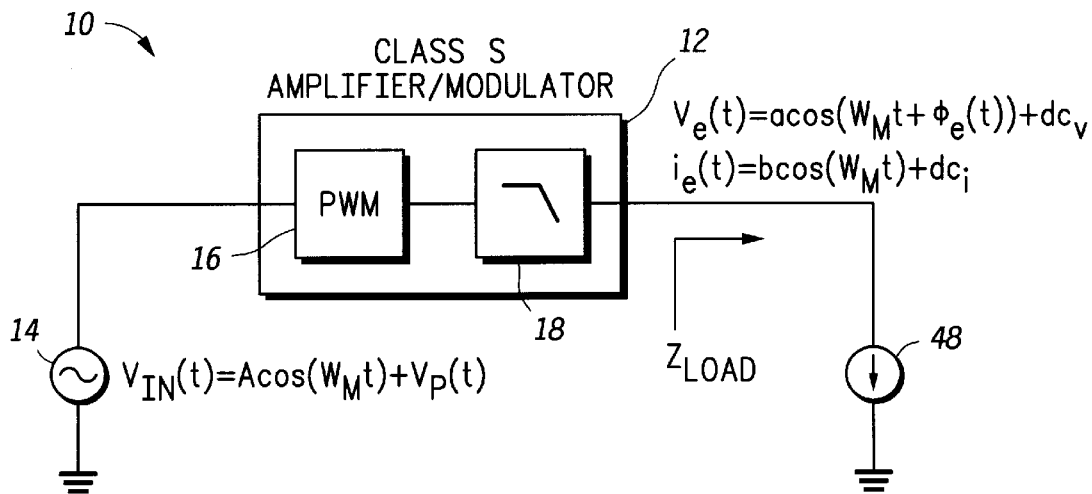
FIG. 1 is a block diagram generally depicting an amplifier for receiving a sinusoidal input signal and producing an amplified output signal.
Figure 2:
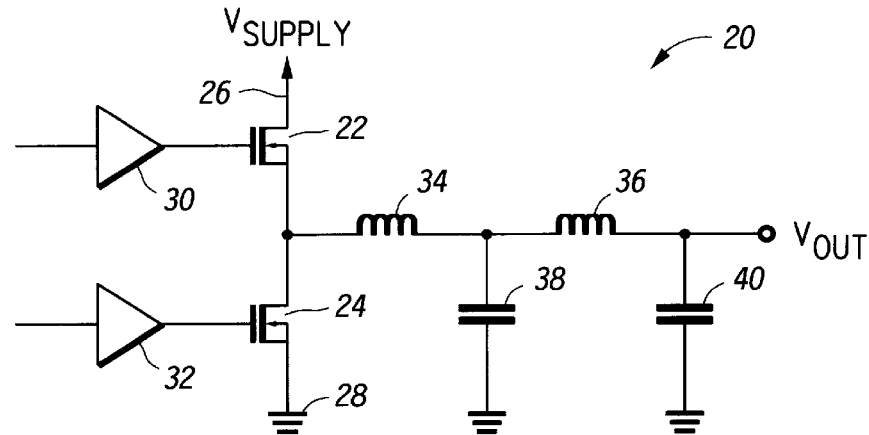
FIG. 2 is a circuit schematic of an example of an output drive stage and low pass filter for a class S amplifier.
Figure 3:
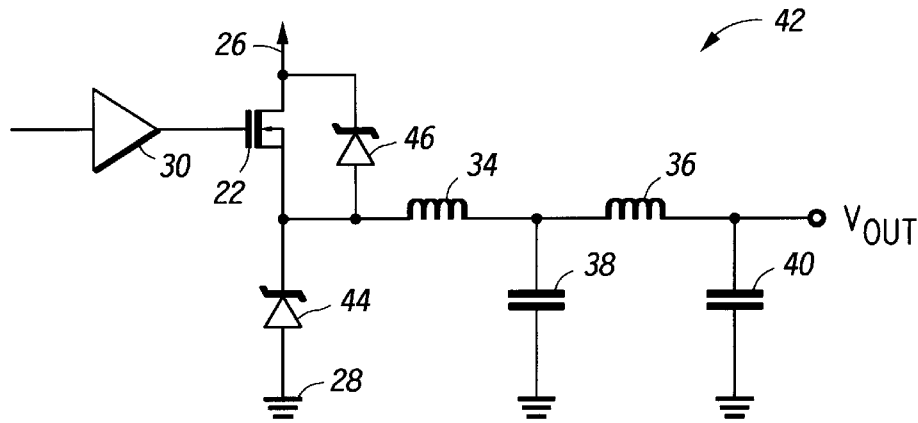
FIG. 3 is a circuit schematic of an example of an output drive stage and low pass filter for a class S modulator.
Figure 4:
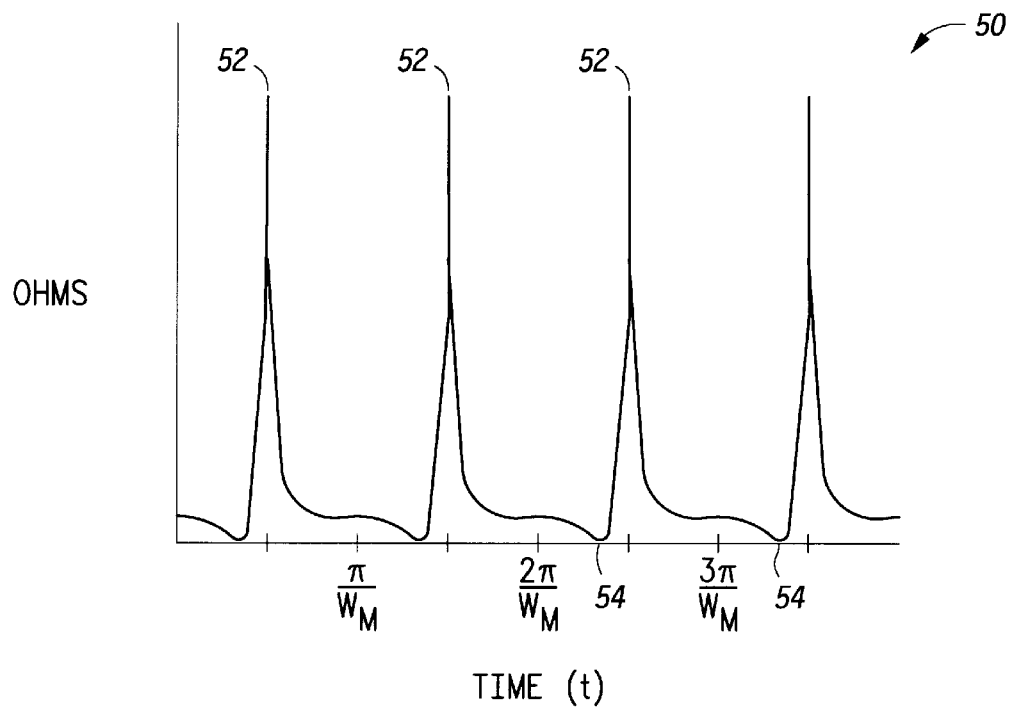
FIG. 4 is a graph of the equivalent output impedance seen by a class S amplifier versus time when driving a class AB amplifier.
Figure 5:
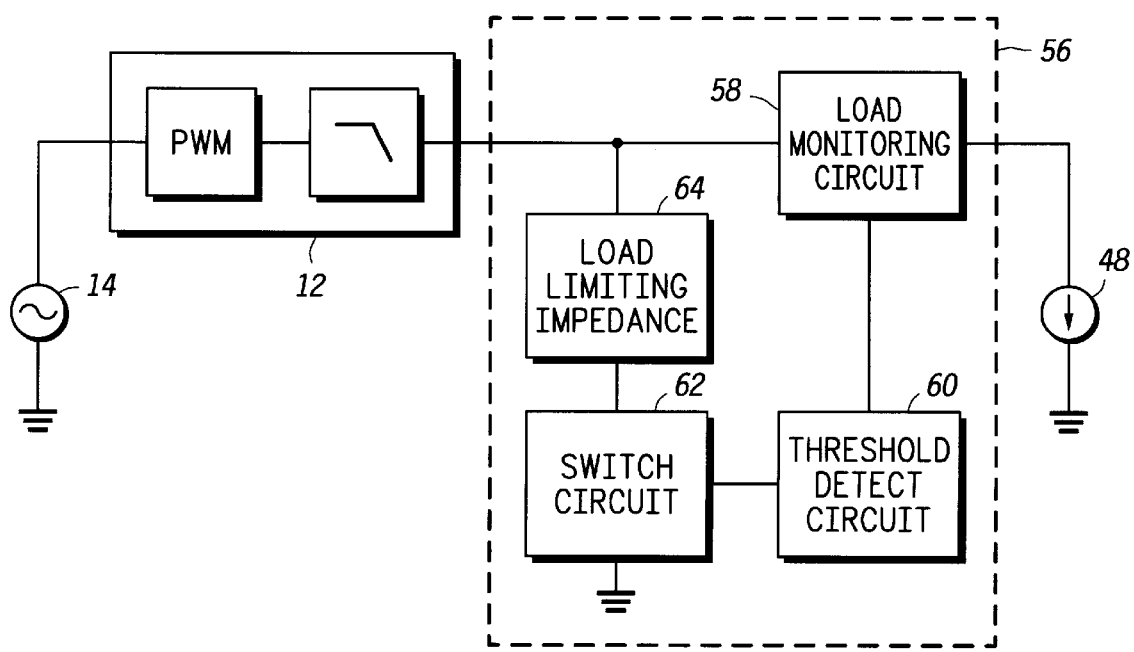
FIG. 5 is a block diagram generally depicting a load limiting circuit in accordance with the present invention coupled to the output of a class S amplifier/modulator.

Referring now to the drawings in greater detail, there is generally depicted in FIG. 5 a block diagram of a load limiting circuit 56 in accordance with the present invention. The load limiting circuit 56 is coupled between the output of a class S amplifier/modulator 12 and the load being driven by the amplifier. In the preferred embodiment the load being driven by the amplifier is a class AB amplifier depicted by a current source 48.

The load limiting circuit 56 includes a load monitoring circuit 58 coupled between the class S amplifier/modulator 12 and the current source 48, for detecting the value of the output impedance. The load monitoring circuit 58 is coupled to a threshold detect circuit 60, which compares the value of the output impedance to a predetermined threshold. The threshold detect circuit 60 is coupled to a switch circuit 62, for selectively coupling a load limiting impedance 64, in parallel with the current source 48, in response to the threshold detect circuit 60 detecting the output impedance rising above the predetermined threshold.

Figure 6:
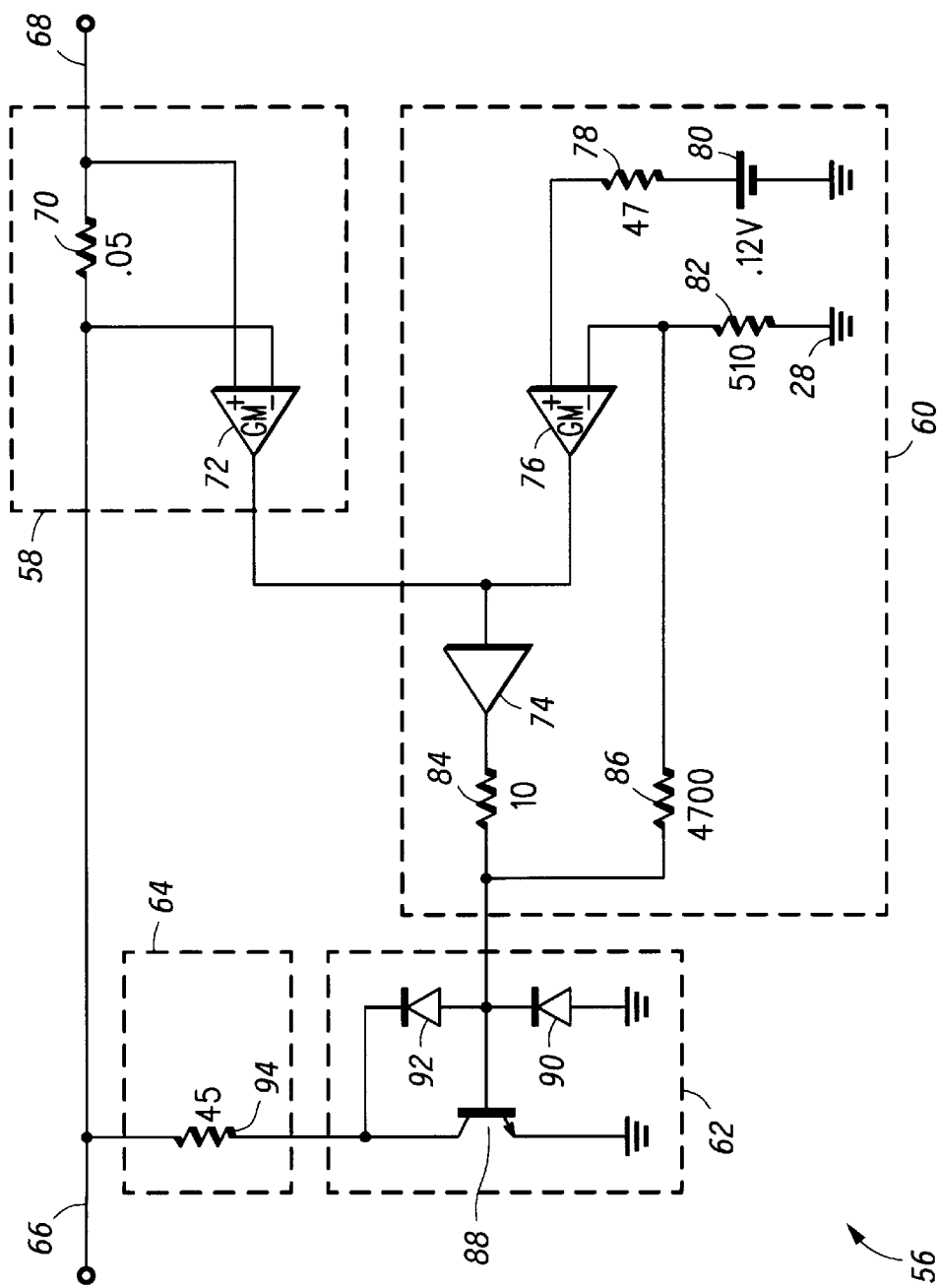
FIG. 6 is a circuit schematic of a preferred embodiment of the load limiting circuit, shown in FIG. 5.

FIG. 6, is a circuit schematic of a preferred embodiment of the load limiting circuit 56, shown in FIG. 5. The load limiting circuit includes an input terminal 66 coupled to the output of an amplifier. The amplifier corresponds to the class S amplifier/modulator 12, shown in FIG. 5. The input terminal 66 is further coupled to the load monitoring circuit 58, which is coupled to an output terminal 68 for detecting the value of an output impedance coupled to the output terminal 68. In one example, shown in FIG. 5, the output impedance is represented by a current source 48, and corresponds to the output impedance associated with driving a class AB amplifier.

The load monitoring circuit 58 includes a sense resistor 70 in series with the input terminal 66 and the output terminal 68, which produces a voltage drop across the sense resistor 70 corresponding to the current flowing from the class S amplifier 12 through the load monitoring circuit 58 to the current source 48. The load monitoring circuit 58 further includes a first transconductance amplifier 72 having a positive input terminal coupled to the end of the sense resistor 70 coupled to the output terminal, and a negative input terminal coupled to the end of the sense resistor 70 coupled to the input terminal 66.

The first transconductance amplifier 72 monitors the voltage drop across the sense resistor 70 and sinks a current corresponding to the voltage drop across the sense resistor 70. Together the sense resistor 70 and the first transconductance amplifier 72 form a current sense circuit which determines the value of the output impedance by detecting the output current.

The output of the first transconductance amplifier 72 is coupled to the input of a buffer 74, as part of the threshold detect circuit 60. The input of the buffer 74 is further coupled to a second transconductance amplifier 76, which produces a current corresponding to the value of a predetermined threshold. The value of the predetermined threshold is determined by the positive input terminal of the second transconductance amplifier 76 being coupled to a resistor 78 in series with a voltage source 80, and the negative input terminal being coupled to ground via resistor 82.

The buffer 74 produces an output signal corresponding to the sum of the currents produced by the first transconductance amplifier 72 and the second transconductance amplifier 76, which relates to the output impedance rising above said predetermined value. The output of the buffer 74 is coupled to the input of the switch circuit 62 via a resistor 84. The output of the buffer 74 is further fed back to the negative input terminal of second transconductance amplifier 76 via a resistor 36 coupled to resistor 84.

The switch circuit 62 includes a bipolar transistor 88 with its base coupled to the output of the buffer 74 via resistor 84. The transistor 88 effectively operates as a switch, which opens and closes dependent upon the signal received from the threshold detect circuit 60. The emitter of transistor 88 is coupled to ground 28 and the collector of the transistor 88 is coupled to a load limiting impedance 64.

The preferred embodiment of the switch circuit 62 includes a first diode 90 having its anode coupled to the base of transistor 88, and its cathode coupled to ground 28. The switch circuit 62 further includes a second diode 92 having its anode coupled to the collector of transistor 88, and its cathode coupled to the base of transistor 88. The first diode 90 and the second diode 92 operate as clamping diodes which prevent saturation in transistor 88, allowing for the transistor 88 to have faster switching speeds.

The load limiting impedance 64 includes a resistor 94 having one end coupled to the input terminal 66 and the other end coupled to the collector of transistor 88. When transistor 88 turns on, the series combination resistor 94 and transistor 88 provide an alternative parallel path to ground for the output of the amplifier 12 coupled to the input terminal 66. The alternative parallel path to ground 28 limits the value of the output impedance seen by the amplifier 12, when the value of the output impedance associated with the current source 48 rises above the predetermined value.

The transistor turning on and creating the alternative parallel path to ground only occurs when the current from the amplifier 12 is close to or at zero, and therefore there is very little current which can be diverted through the alternative parallel path and the load limiting impedance 64. Correspondingly very little power is Lost through the alternative path. At the same time the output impedance seen by amplifier 12 is prevented from rising to too high of a value, which allows th(e amplifier 12 to maintain efficient operation at higher frequencies.

From the foregoing description, it will be apparent that the load limiting circuit and method for limiting the output impedance seen by an amplifier of the present invention has a number of advantages, some of which have been described above and others of which are inherent in the invention. Also it will be understood that modifications can be made to the load limiting circuit and method described above without departing from the teachings of the invention.

We claim:

1. A load limiting circuit for limiting the output impedance seen by an amplifier comprising:

a load monitoring circuit for detecting the value of the output impedance;

a threshold detect circuit, coupled to said load monitoring circuit for comparing the value of the output impedance to a predetermined value;

a load limiting impedance; and a switch circuit coupled to said threshold detect circuit and said load limiting impedance for selectively coupling said load limiting impedance in parallel with the output impedance when the value of the output impedance rises above said predetermined value, said load monitoring circuit including a current sense circuit for detecting the output current, and wherein said threshold detect circuit detects the value of the output impedance rising above said predetermined value by comparing the value of the output current to the value of a corresponding predetermined threshold.

2. The load limiting circuit of claim 1, wherein said current sense circuit includes a sense resister in series with the output impedance, wherein said current sense circuit measures the current by monitoring the voltage drop across said sense resistor.

3. The load limiting circuit of claim 2, wherein said current sense circuit further includes a transconductance amplifier having a pair of differential inputs, each differential input being coupled to an opposite end of said sense resistor.

4. The load limiting circuit of claim 1, wherein said load limiting impedance is a resistor.

5. The load limiting circuit of claim 1, wherein said switch circuit includes a transistor.

6. The load limiting circuit of claim 5, wherein said transistor is a bipolar transistor having a base coupled to the threshold detect circuit, a collector coupled to the load limiting impedance, and an emitter coupled to ground.

7. A method for limiting the output impedance seen by an amplifier comprising the steps of:

detecting the value of the output impedance;

comparing the value of the output impedance to a predetermined value; and selectively coupling a load limiting impedance in parallel with the output impedance when the value of the output impedance rises above said predetermined value;

wherein said step of detecting the value of the output impedance includes sensing the output current and wherein said step of comparing the value of the output impedance to a predetermined value includes comparing the value of the output current to a corresponding predetermined threshold.

8. The method of claim 7, wherein said step of sensing the output current includes measuring a voltage drop across a known sense resistor in series with the output impedance.

9. The method of claim 7, wherein said step of selectively coupling a load limiting impedance in parallel with the output impedance includes turning on and off a transistor coupled in series with a load limiting impedance, the series combination of said transistor and said load limiting impedance being coupled in parallel with the output impedance.

* * * * *